(12) United States Patent
Yanagihara et al.

(10) Patent No.: US 6,407,617 B1
(45) Date of Patent: Jun. 18, 2002

(54) BIAS CIRCUIT AND METHOD OF FABRICATING SEMICONDUCTOR DEVICE

(75) Inventors: Manabu Yanagihara; Tsuyoshi Tanaka; Akihisa Sugimura, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/714,131

(22) Filed: Nov. 17, 2000

(30) Foreign Application Priority Data

Nov. 19, 1999 (JP) .............................. 11-329515

(51) Int. Cl.[7] ................................ H03K 3/01
(52) U.S. Cl. ...................................... 327/534
(58) Field of Search .................. 327/483, 530, 327/534, 535, 538, 540, 542, 545, 575

(56) References Cited

U.S. PATENT DOCUMENTS

| | | | | |
|---|---|---|---|---|
| 5,051,623 A | * | 9/1991 | Yarbrough et al. | ......... 307/473 |
| 5,153,456 A | * | 10/1992 | Keown | ......... 307/443 |
| 5,173,621 A | * | 12/1992 | Fraser et al. | ......... 307/443 |
| 5,408,136 A | * | 4/1995 | Ovens et al. | ......... 327/108 |
| 5,837,589 A | | 11/1998 | McNamara et al. | ......... 438/314 |
| 5,917,341 A | * | 6/1999 | Suder et al. | ......... 326/84 |
| 6,127,876 A | * | 10/2000 | Soltero | ......... 327/314 |

* cited by examiner

*Primary Examiner*—Jeffrey Zweizig
(74) *Attorney, Agent, or Firm*—Eric J. Robinson; Nixon Peabody LLP (57) ABSTRACT

The invention provides a bias circuit for suppressing change with temperature of an idle current of a power transistor and a semiconductor device including the bias circuit. The bias circuit includes a first bipolar transistor having an emitter, a base and a collector, and at least one Schottky diode connected to the base of the first bipolar transistor, and the at least one Schottky diode is provided for supplying a base potential for suppressing a collector current of the first bipolar transistor from changing in accordance with temperature change.

6 Claims, 11 Drawing Sheets

PRIOR ART

BIAS CIRCUIT AND METHOD OF FABRICATING SEMICONDUCTOR DEVICE

BACKGROUND OF THE INVENTION

The present invention relates to a bias circuit and a method of fabricating a bipolar integrated circuit in which elements of the bias circuit are integrated.

Recently, a field effect transistor formed from GaAs with small power consumption (MESFET) is widely used as a transistor of a transmitting power amplifier used in mobile communication equipment such as a portable telephone. A negative power source is generally used for bias for a gate electrode of a MESFET. Accordingly, in using a MESFET in a transmitting power amplifier, two power sources, namely, a positive power source and a negative power source, are required. This is a disadvantage to downsizing of the amplifier, and hence, a transistor operated by a positive power source alone is earnestly desired.

Furthermore, in recent communication systems such as CDMA (code division multi-channel access), an output current of a transmitting power amplifier is required to have small distortion (namely, to be linear). As a transistor meeting these requirements, a heterojunction bipolar transistor (HBT) including the emitter formed from a semiconductor having a larger band gap than a semiconductor forming the base is practically used.

Figure 10:
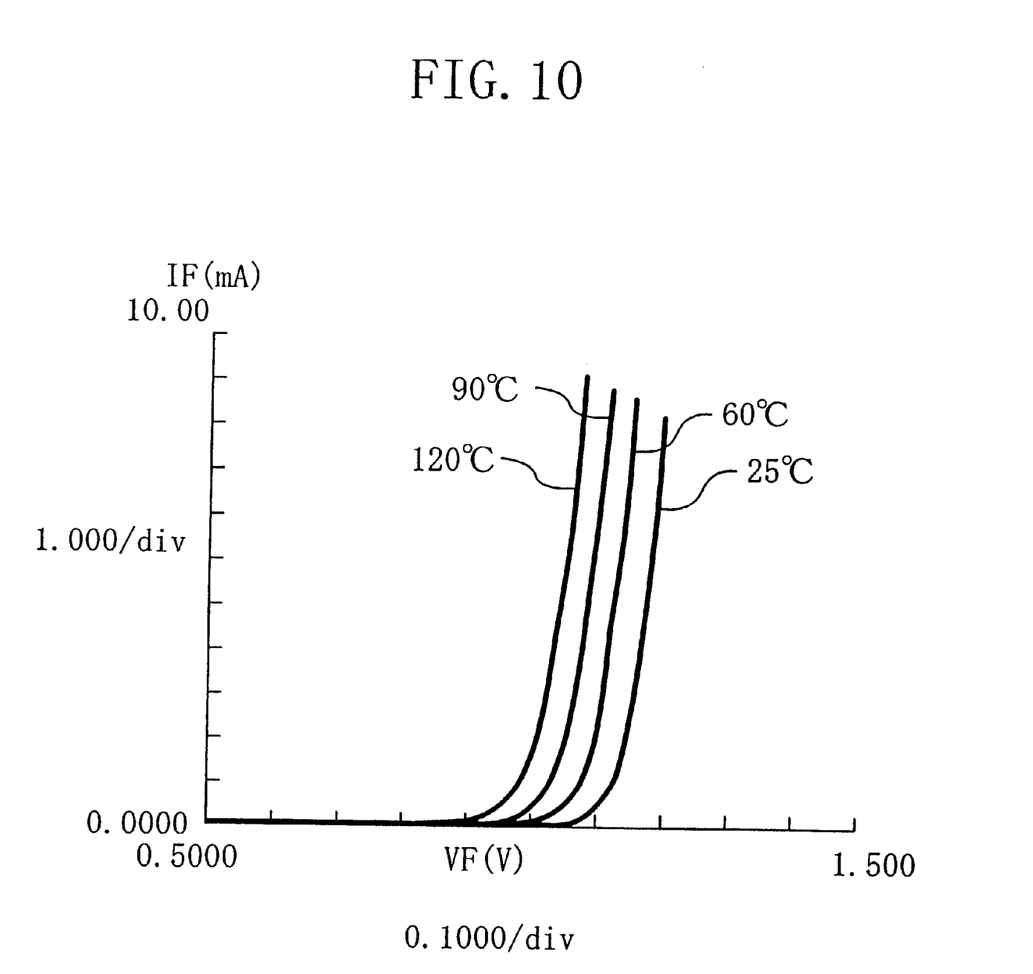
FIG. 10 is a diagram for showing current-voltage characteristics at various temperatures of a PN diode obtained by short-circuiting the base and the collector of an HBT.

In a conventional power amplifier using HBTs, a bias circuit is generally constructed on the same chip for supplying a current necessary for the base of an HBT used as a power transistor. An HBT has, however, a characteristic that the on state voltage decreases as the temperature increases as is shown in FIG. 10 (which characteristic is hereinafter referred to as the temperature characteristic of an HBT). Therefore, when a given voltage is applied between the base and the emitter, a collector current (hereinafter referred to as the idle current) of the HBT is largely increased as the temperature increases. Accordingly, the bias circuit is required to reduce change with temperature of the idle current of the HBT serving as the power transistor.

A bias circuit for overcoming the problem will now be described with reference to FIG. 11, which shows a bias circuit 100 used in a conventional power amplifier.

The base terminal of a bipolar transistor Tro101 serving as a power transistor is connected through a resistor R103 of 4 Ω to a bipolar transistor Tr102 so as to compose an emitter-follower circuit. Also, the base terminal of the transistor Tr102 is grounded through transistors Tr103 and Tr104 in each of which the base and the collector are short-circuited. The transistors Tr103 and Tr104 are PN diodes having the same on state voltage as the transistors Tr101 and Tr102. When the temperature is increased in this circuit, the idle current C of the transistor Tr101, that is, the HBT, is increased owing to the temperature characteristic. On the other hand, a current flowing through the transistors Tr103 and Tr104 is also increased owing to the same temperature characteristic. Accordingly, a current flowing through a resistor R101 connected to the transistors Tr103 and Tr104 in series is increased. Since the resistance of the resistor R101 is constant (530 Ω), a voltage applied to the resistor R101 is increased as the current increases. In other words, a potential at a point $P_5$ of FIG. 11 is lowered. Accordingly, the base potential of the transistor Tr102 connected to the resistor R101 is lowered. As a result, the emitter current of the transistor Tr102 is decreased, so as to lower the base potential of the power transistor Tr101. In this manner, the idle current C of the power transistor Tr101 can be suppressed from increasing.

Figure 11:
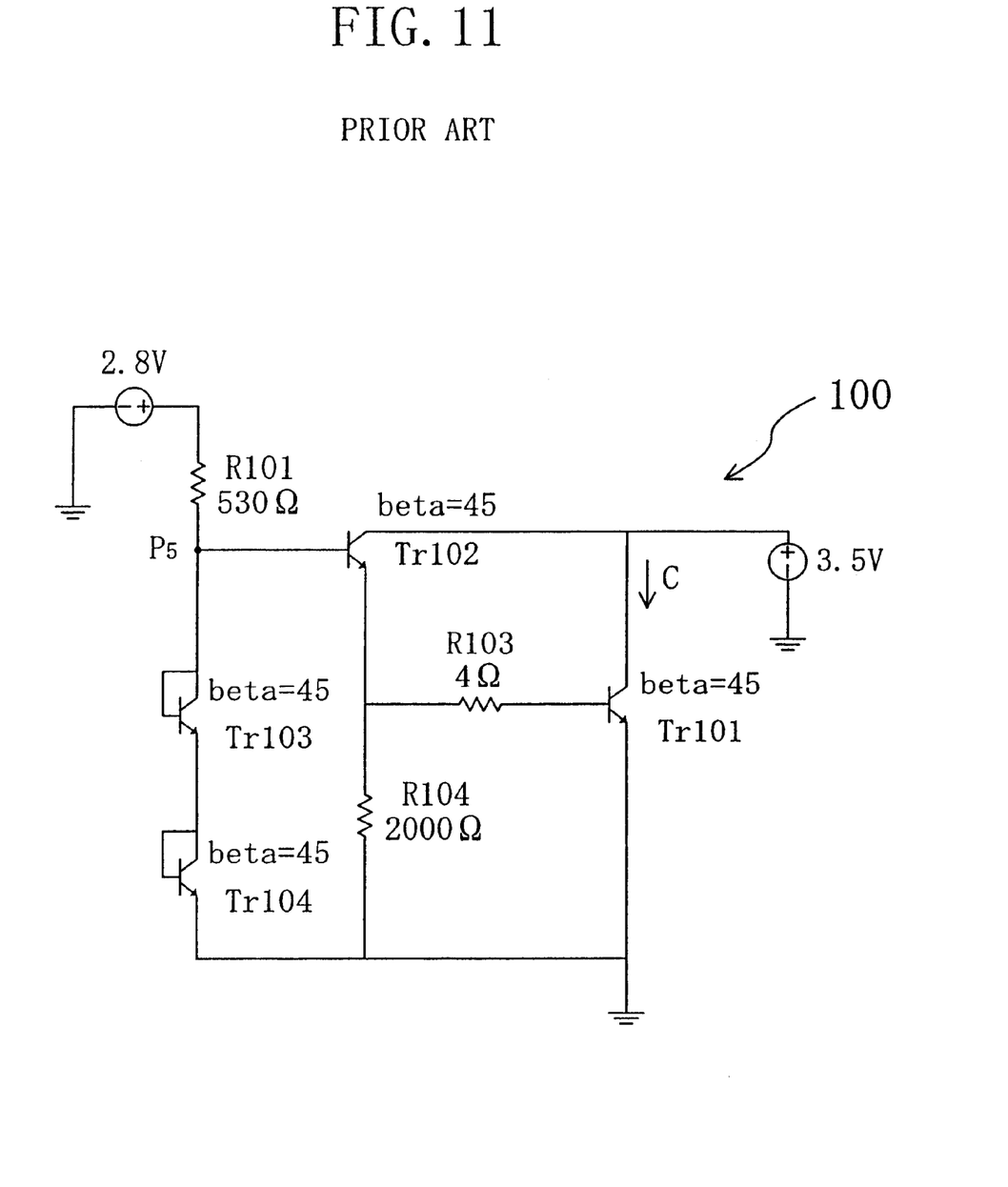
FIG. 11 is a circuit diagram of a conventional bias circuit.

The bias circuit too of FIG. 11 thus suppresses the idle current C of the power transistor Tr101 from increasing in accordance with the temperature increase.

In the conventional bias circuit 100, however, the suppression of the change of the idle current is disadvantageously insufficient.

SUMMARY OF THE INVENTION

The present invention was devised to overcome the aforementioned disadvantage, and an object is providing a bias circuit in which change with temperature of an idle current of a power transistor is suppressed and a method of fabricating a semiconductor device including the bias circuit.

The bias circuit of this invention comprises a first bipolar transistor having an emitter, a base and a collector; and at least one Schottky diode connected to the base of the first bipolar transistor, and the at least one Schottky diode is disposed for supplying a base potential for suppressing a collector current of the first bipolar transistor from changing in accordance with temperature change.

In a bipolar transistor, the collector current is changed in accordance with temperature change when a given voltage is applied between the base and the emitter. Since the Schottky diode is provided so as to supply a base potential for suppressing the change, a substantially constant collector current can be obtained regardless of the temperature change.

The bias circuit preferably further comprises a second bipolar transistor having an emitter, a base and a collector; a PN diode connected to the base of the second bipolar transistor; and two or more Schottky diodes connected to the base of the second bipolar transistor, and the emitter of the second bipolar transistor is preferably connected to the base of the first bipolar transistor, and the two or more Schottky diodes are preferably connected to the PN diode in series.

When the PN diode and the two or more Schottky diodes are connected to the base of the second bipolar transistor, a current flowing through the PN diode and the two or more Schottky diodes is increased as the temperature increases with a given voltage applied to the bias circuit, and hence, the base potential of the second bipolar transistor can be lowered. As a result, the emitter current of the second bipolar transistor is decreased, so as to lower the base potential of the first bipolar transistor. Accordingly, the collector current of the first bipolar transistor can be suppressed from increasing. When the temperature decreases, the collector current of the first bipolar transistor can be suppressed from decreasing in accordance with the temperature decrease through a mechanism completely reverse to that described above. In particular, a Schottky diode has a smaller on state voltage than a PN diode used in the conventional bias circuit. Also, the change with temperature of the on state voltage of the Schottky diode is substantially the same as change with temperature of the on state voltage of the PN diode. Accordingly, in the two or more serially connected Schottky diodes, the change of a current caused by changing the temperature under application of the same voltage as in the PN diode can be larger than in the PN diode. As a result, the base potential of the first bipolar transistor can be more largely changed so as to more sufficiently suppress the change of the collector current of the first bipolar transistor.

The bias circuit preferably further comprises a second bipolar. transistor having an emitter, a base and a collector; and three or more Schottky diodes connected to the base of the second bipolar transistor in series, and the emitter of the second bipolar transistor is preferably connected to the base of the first bipolar transistor.

In the three or more serially connected Schottky diodes, the change of a current caused by changing the temperature under application of the same voltage as in the PN diode can be larger than in the PN diode. Accordingly, the base potential of the first bipolar transistor can be more largely changed so as to more sufficiently suppress the change of the collector current of the first bipolar transistor.

The bias circuit preferably further comprises at least one Schottky diode connected to be branched from connection between the emitter of the second bipolar transistor and the base of the first bipolar transistor.

In the Schottky diode connected to be branched from the connection of the base of the first bipolar transistor, the change of a current caused by changing the temperature under application of the same voltage in a PN diode can be larger than in the PN diode. Accordingly, the base potential of the first bipolar transistor can be more largely changed so as to more sufficiently suppress the change of the collector current of the first bipolar transistor.

The first and second bipolar transistors can be heterojunction bipolar transistors.

The bias circuit preferably further comprises a second bipolar transistor having an emitter, a base and a collector; and one or more Schottky diodes connected to the base of the second bipolar transistor in series, and the collector of the second bipolar transistor is preferably connected to the base of the first bipolar transistor.

When the temperature is increased, the on state voltage of each of the one or more Schottky diodes serially connected to the base of the second bipolar transistor is decreased, and hence, the base potential of the second bipolar transistor is increased. As a result, the collector current of the second bipolar transistor is increased not only due to the temperature increase but also due to the increase of the base potential. When the collector current of the second bipolar transistor is increased, the base potential of the first bipolar transistor connected to the collector of the second bipolar transistor is lowered. Accordingly, the collector current of the first bipolar transistor can be suppressed from increasing in accordance with the temperature increase. When the temperature is decreased, the collector current of the first bipolar transistor can be suppressed from decreasing in accordance with the temperature decrease through a mechanism completely reverse to that described above.

The method of this invention of fabricating a semiconductor device including a bipolar transistor having an emitter, a base and a collector, a semiconductor region and a Schottky diode having a Schottky electrode in Schottky contact with the semiconductor region, comprises the steps of (a) forming an emitter electrode on a semiconductor substrate including a first semiconductor layer of a first conductivity type, a second semiconductor layer of a second conductivity type deposited on the first semiconductor layer and a third semiconductor layer of the first conductivity type deposited on the second semiconductor layer; (b) forming an emitter layer and a base layer by patterning the third semiconductor layer and the second semiconductor layer by using an etching mask masking the emitter electrode and an area around the emitter electrode, and exposing a surface of the first semiconductor layer after forming the emitter layer and the base layer; (c) forming an isolation region for dividing the first semiconductor layer between a collector region and a Schottky diode region after the step (b); (d) exposing part of a surface of the base layer by patterning the emitter layer; and (e) forming a base electrode on the exposed surface of the base layer, and forming the Schottky electrode on the first semiconductor layer in the Schottky diode region.

According to this method, a semiconductor device including a bipolar transistor and a Schottky diode formed on the same substrate can be fabricated.

In the step (e), the base electrode and the Schottky electrode are preferably simultaneously formed.

Thus, there is no need to conduct additional procedures for forming a-new semiconductor layer and forming a Schottky electrode in order to add a Schottky diode to the semiconductor device. In other words, a semiconductor device including a Schottky diode formed on the same chip can be fabricated without increasing the number of procedures as compared with that of a method of fabricating a conventional semiconductor device including a bipolar transistor.

In the step (a), the semiconductor substrate can further include, below the first semiconductor layer, a fourth semiconductor layer having a higher concentration of an impurity of the first conductivity type than the first semiconductor layer, in the step (c), the isolation region can also divides the fourth semiconductor layer between the collector region and the Schottky diode region, and the method can further include, after the step (b), the steps of forming, in the first semiconductor layer, openings for exposing a surface of the fourth semiconductor layer in the collector region and in the Schottky diode region; and simultaneously forming a collector electrode and an ohmicelectrode on the fourth semiconductor layer within the openings.

The forbidden band with of a semiconductor used for forming the third semiconductor layer can be larger than that of a semiconductor used for forming the second semiconductor layer.

DETAILED DESCRIPTION OF THE INVENTION

Now, preferred embodiments of the invention will be described with reference to the accompanying drawings, in which like reference numerals are used to refer to elements commonly used in the respective embodiments for simplification.

EMBODIMENT 1

Figure 1:
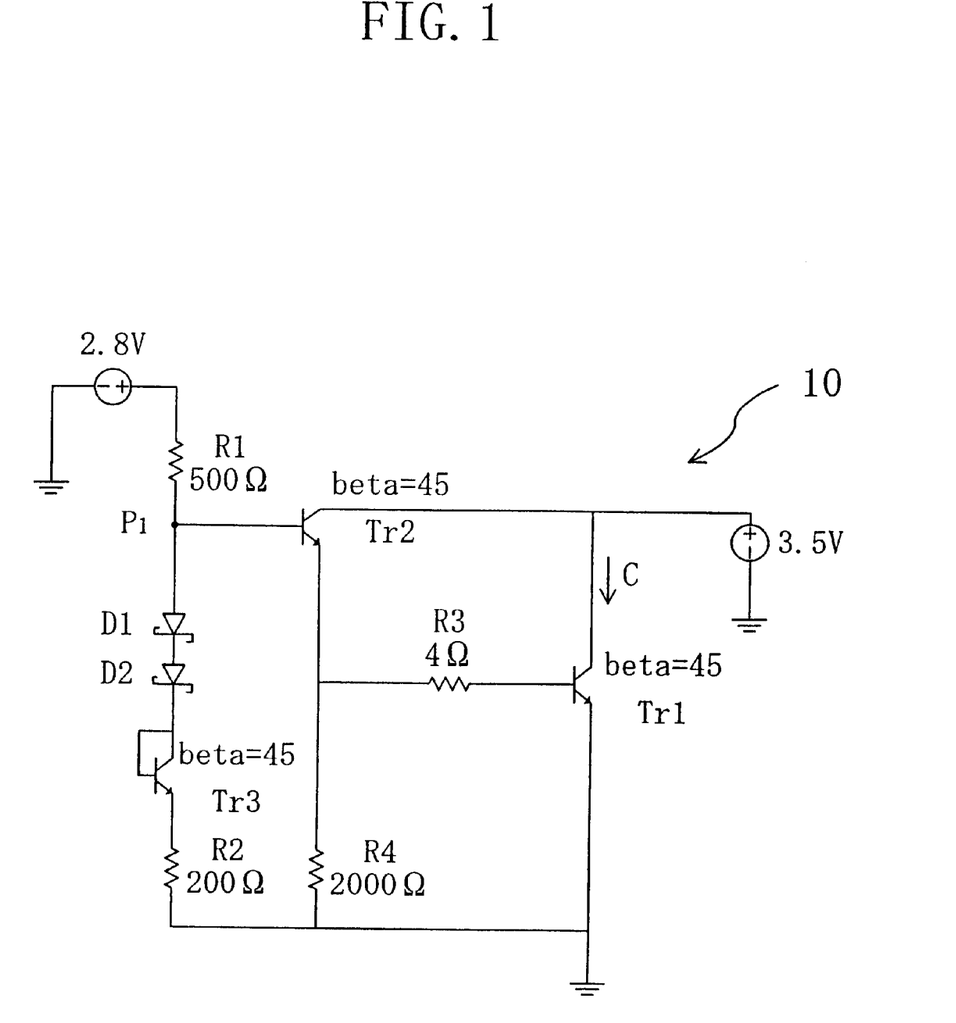
FIG. 1 is a circuit diagram of a bias circuit according to Embodiment 1 of the invention.

FIG. 1 is a circuit diagram of a bias circuit 10 of Embodiment 1.

As is shown in FIG. 1, the bias circuit 10 includes bipolar transistors Tr1, Tr2 and Tr3, Schottky diodes D1 and D2, and resistors R1 (500 Ω), R2 (200 Ω), R3 (4 Ω) and R4 (2000 Ω). All the bipolar transistors Tr1, Tr2 and Tr3 have a current amplification factor (β) of 45. The base terminal of the transistor Tr1 functioning as a power transistor is connected through the resistor R3 to the transistor Tr2 so as to compose an emitter-follower circuit. Also, the base terminal of the transistor Tr2 is grounded through the Schottky diodes D1 and D2 and the transistor Tr3 whose base and collector are short-circuited. The transistor Tr3 is a PN diode having the same on state voltage as the transistors Tr1 and Tr2.

When the temperature is increased in the bias circuit 10 of FIG. 1, the idle current C of the transistor Tr1 is increased owing to the temperature characteristic. Also, a current flowing through the Schottky diodes D1 and D2 and the transistor Tr3 is increased owing to the same temperature characteristic. Accordingly, a current flowing through the resistor R1 serially connected to the Schottky diodes D1 and D2 and the transistor Tr3 is increased. Since the resistance of the resistor R1 is constant (500 Ω), a voltage applied to the resistor R1 is increased as the current increases. In other words, a potential at a point $P_1$ of FIG. 1 is lowered. Accordingly, the base potential of the transistor Tr2 connected to the resistor R1 is lowered. As a result, the emitter current of the transistor Tr2 is decreased, so as to lower the base potential of the power transistor Tr1. In this manner, the idle current C of the power transistor Tr1 is suppressed from increasing.

The resistor R2 is provided so as to suppress increase of a current flowing through the Schottky diodes D1 and D2 when the on state voltage of the Schottky diode becomes smaller than a half of the on state voltage of the PN diode owing to the temperature increase.

Figure 2:
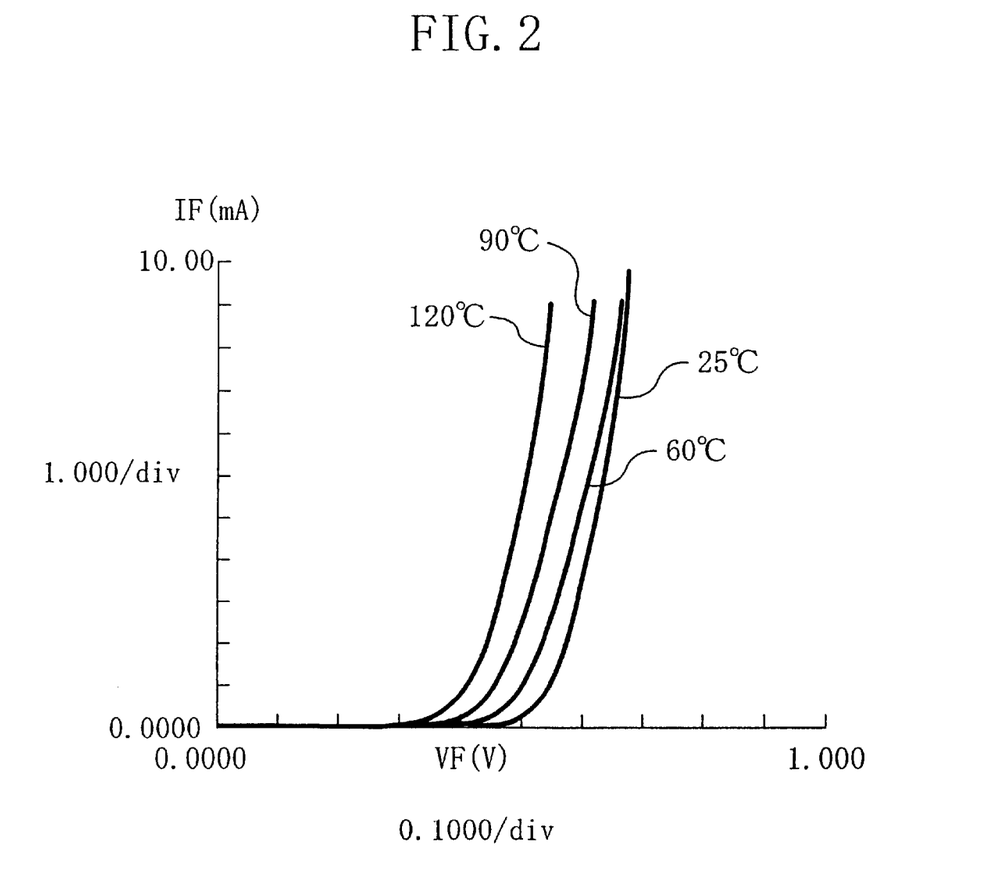
FIG. 2 is a diagram of current-voltage characteristics at various temperatures of a Schottky diode.

In other words, the bias circuit 10 of FIG. 1 is obtained by replacing the transistor Tr103 of the conventional bias circuit 100 of FIG. 11 with the Schottky diodes D1 and D2. The reason is as follows, whereas the transistor Tr3 of this embodiment and the transistor Tr104 of the conventional bias circuit 100 are the same bipolar transistors:

The bipolar transistors Tr103 and Tr104 of FIG. 11 whose base and collector are short-circuited have an on state voltage of approximately 1.1 V at room temperature (25° C.) as is shown in FIG. 10. On the other hand, the Schottky diode has an on state voltage of approximately 0.55 V at room temperature (25° C.) as is shown in FIG. 2, which is substantially a half of that of the transistor Tr103 or Tr104. Furthermore, as is shown in FIG. 2, change of the on state voltage of the Schottky diode in accordance with the temperature change is approximately -1.4 mV/° C., which is substantially equal to that of the transistor Tr103 or Tr104. Accordingly, change of a current flowing through the Schottky diode with a given voltage applied between the base and the emitter and with the ambient temperature changed is substantially equal to that in the transistor Tr103 or Tr104 of FIG. 11.

Accordingly, when one of the transistors Tr103 and Tr104 is replaced with two serially connected Schottky diodes, the bias circuit can be operated at substantially the same on state voltage as the conventional bias circuit 100 and the change of the potential at the point $P_1$ in accordance with the temperature change can be increased to be approximately 1.5 times as large as the change of the potential at the point $P_5$.

In the bias circuit 10 of this embodiment constructed in consideration of the aforementioned temperature characteristic of the Schottky diode, the total change of the on state voltages of the Schottky diodes D1 and D2 and the transistor Tr3 in accordance with the temperature increase is approximately 1.5 times as large as the total change of the on state voltages of the transistors Tr103 and Tr104. Therefore, the current flowing through the resistor R1 is more largely increased than in the resistor R101 of the conventional bias circuit 100. Since the resistance of the resistor R1 is constant (500 Ω), the voltage applied to the resistor R1 is more largely increased as the current increases than in the resistor R101 of the conventional bias circuit 100. In other words, the potential at the point $P_1$ is more largely lowered than that at the point $P_5$ of the conventional bias circuit 100. Accordingly, the base potential of the transistor Tr2 is more largely lowered than in the conventional bias circuit 100. As a result, the emitter current of the transistor Tr2 is more largely decreased in accordance with the temperature increase than in the conventional bias circuit 100. In other words, the base potential of the transistor Tr1 is more largely lowered in accordance with the temperature increase than in the conventional bias circuit 100. Since the base potential of the transistor Tr1 is more largely lowered, the idle current C of the transistor Tr1 is more largely suppressed from increasing in accordance with the temperature increase.

In the case of temperature decrease, the idle current C of the transistor Tr1 can be suppressed from decreasing in accordance with the temperature decrease through a mechanism completely reverse to that described above.

EMBODIMENT 2

Figure 3:
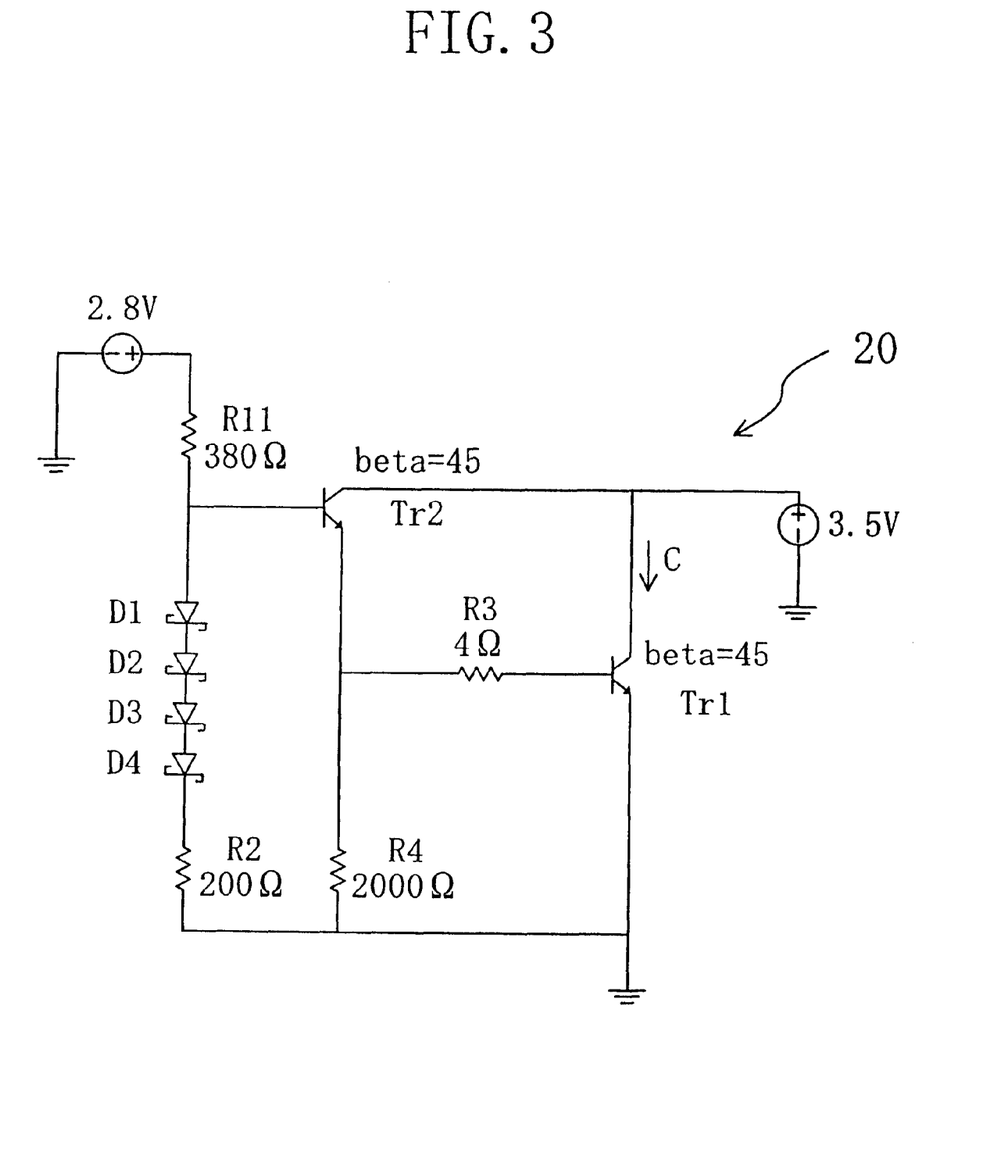
FIG. 3 is a circuit diagram of a bias circuit according to Embodiment 2 of the invention.

FIG. 3 is a circuit diagram of a bias circuit 20 of Embodiment 2.

As is shown in FIG. 3, the bias circuit 20 includes bipolar transistors Tr1 and Tr2, Schottky diodes D1, D2, D3 and D4, and resistors R11 (380 Ω), R2 (200 Ω), R3 (4 Ω) and R4 (2000 Ω). Both of the bipolar transistors Tr1 and Tr2 have a current amplification factor (β) of 45. The base terminal of the transistor Tr1 functioning as a power transistor is connected through the resistor R3 to the transistor Tr2 so as to compose an emitter-follower circuit. Also, the base terminal of the transistor Tr2 is grounded through the Schottky diodes D1, D2, D3 and D4.

In the other words, the bias circuit 20 is obtained by replacing the transistors Tr103 and Tr104, that is, the PN diodes, of the conventional bias circuit 100 of FIG. 11 with the Schottky diodes D1, D2, D3 and D4. Specifically, the transistor Tr3 of Embodiment 1 is replaced with the two serially connected Schottky diodes D3 and D4 in this embodiment. Accordingly, the resultant bias circuit can be operated at substantially the same on state voltage, and the change of the base potential of the transistor Tr2 in accordance with the temperature change can be approximately twice as large as that in the conventional bias circuit 100. In other words, the base potential of the transistor Tr2 is more largely changed in accordance with the temperature change than in Embodiment 1. When the temperature is increased, the emitter current of the transistor Tr2 is more largely decreased than in Embodiment 1, so as to more largely lower the base potential of the power transistor Tr1. Accordingly, the idle current C of the transistor Tr1 is more largely suppressed from increasing in accordance with the temperature increase. In the case of temperature decrease, the base potential of the power transistor Tr1 is more largely increased than in Embodiment 1 through the completely reverse mechanism. In this manner, the idle current C of the bipolar transistor Tr1 can be more largely suppressed from changing in accordance with the temperature change.

EMBODIMENT 3

Figure 4:
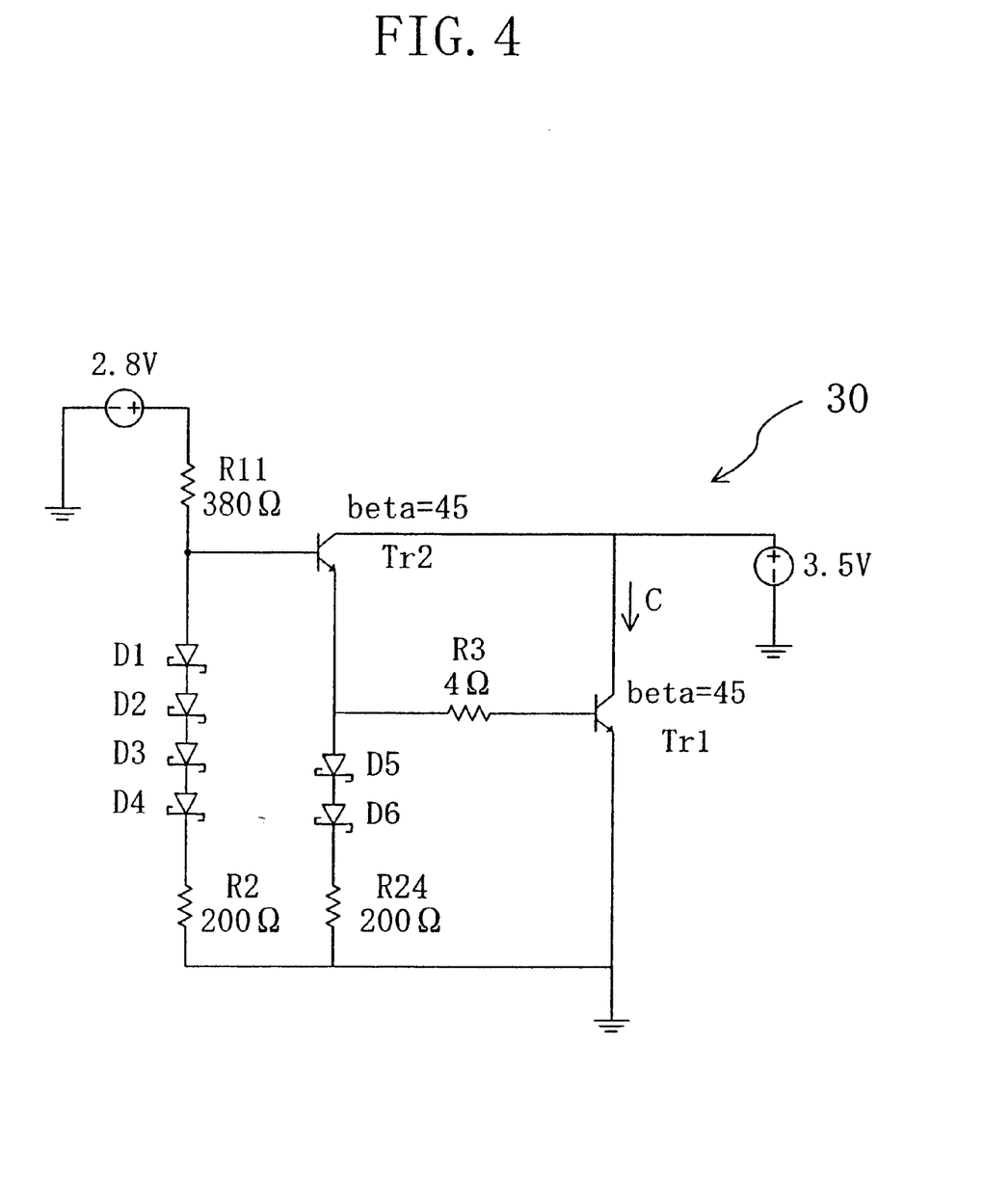
FIG. 4 is a circuit diagram of a bias circuit according to Embodiment 3 of the invention.

FIG. 4 is a circuit diagram of a bias circuit 30 of Embodiment 3.

As is shown in FIG. 4, the bias circuit 30 of this embodiment is different from the bias circuit 20 of Embodiment 2 in the following points alone and has the remaining configuration the same as that of the bias circuit 20 of Embodiment 2: The base terminal of a bipolar transistor Tr1 functioning as a power transistor is connected through a resistor R3 to a bipolar transistor Tr2 so as to compose an emitter-follower circuit, and Schottky diodes D5 and D6 are additionally connected to a resistor R24. Each of the Schottky diodes D5 and D6 is the same as each of Schottky diodes D1 through D4. Also, the resistor R24 (200 Ω) is provided so as to suppress the increase of a current flowing through the Schottky diodes D5 and D6 even when the on state voltage of the Schottky diodes D5 and D6 becomes smaller than a half of the on state voltage of the PN diode.

The Schottky diodes D5 and D6 have a characteristic to increase a flowing current in accordance with the temperature increase similarly to the Schottky diodes D1 through D4. Accordingly, when the temperature is increased, the current flowing through the Schottky diodes D5 and D6 is increased, so as to lower the base potential of the power transistor Tr1. As a result, the idle current C of the power transistor Tr1 can be further suppressed from increasing in accordance with the temperature increase. In the case of temperature decrease, the base potential of the power transistor Tr1 is increased through the completely reverse mechanism. In this manner, the idle current C of the power transistor Tr1 is more largely suppressed from changing in accordance with the temperature change than in the bias circuit of Embodiment 2.

Now, the temperature characteristics of the bias circuits 10, 20 and 30 of Embodiments 1 through 3 and the conventional bias circuit 100 will be described with reference to FIG. 5.

Figure 5:
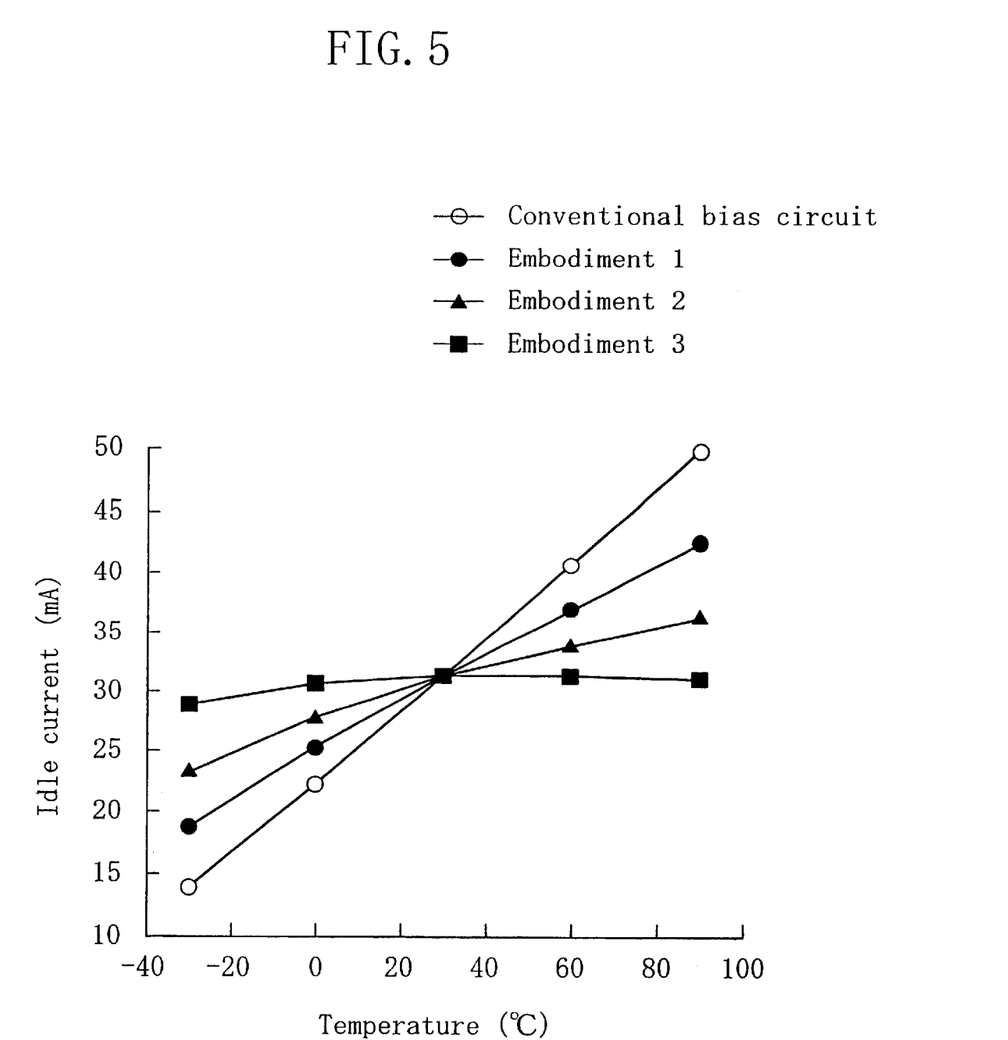
FIG. 5 is a diagram for showing temperature dependency of an idle current flowing through a power transistor.

FIG. 5 shows results obtained by simulating effects of the bias circuits 10, 20 and 30 of Embodiments 1 through 3 and the conventional bias circuit 100. The results are shown by plotting collector currents (idle currents) obtained without supplying power to the power transistor Tr1 or Tr101 in a temperature range between −30° C. and 90° C. In this case, the emitter area of each of the transistors Tr103 and Tr104 of the conventional bias circuit 100 is 1/70 of that of the transistor Tr101.

As is shown in FIG. 5, the change with temperature of the idle current is large in the conventional bias circuit 100, while the change with temperature of the idle current is smaller in the order of Embodiments 1, 2 and 3. In particular, a substantially flat temperature characteristic is obtained in the bias circuit 30 of Embodiment 3.

The emitter area of each of the transistors Tr103 and Tr104 of the conventional bias circuit 100 is approximately 1/10 through 1/100 of the emitter area of the transistor Tro101. Increase of the emitter areas of the transistors Tr103 and Tr104 results in an effect to suppress the change with temperature of the idle current of the power transistor Tr101. However, the increase of the emitter areas also results in increasing a current flowing through the transistors Tr103 and Tr104, namely, increasing current consumption of the bias circuit useless for the power amplifier.

When the bias circuit includes the Schottky diodes as in Embodiments 1 through 3, however, a current flowing through the Schottky diode is substantially the same as a current flowing through the transistor Tr103 or Tr104 of the conventional bias circuit 100. Specifically, the change with temperature of the idle current of the power transistor can be suppressed without increasing the current consumption of the bias circuit.

EMBODIMENT 4

Figure 6:
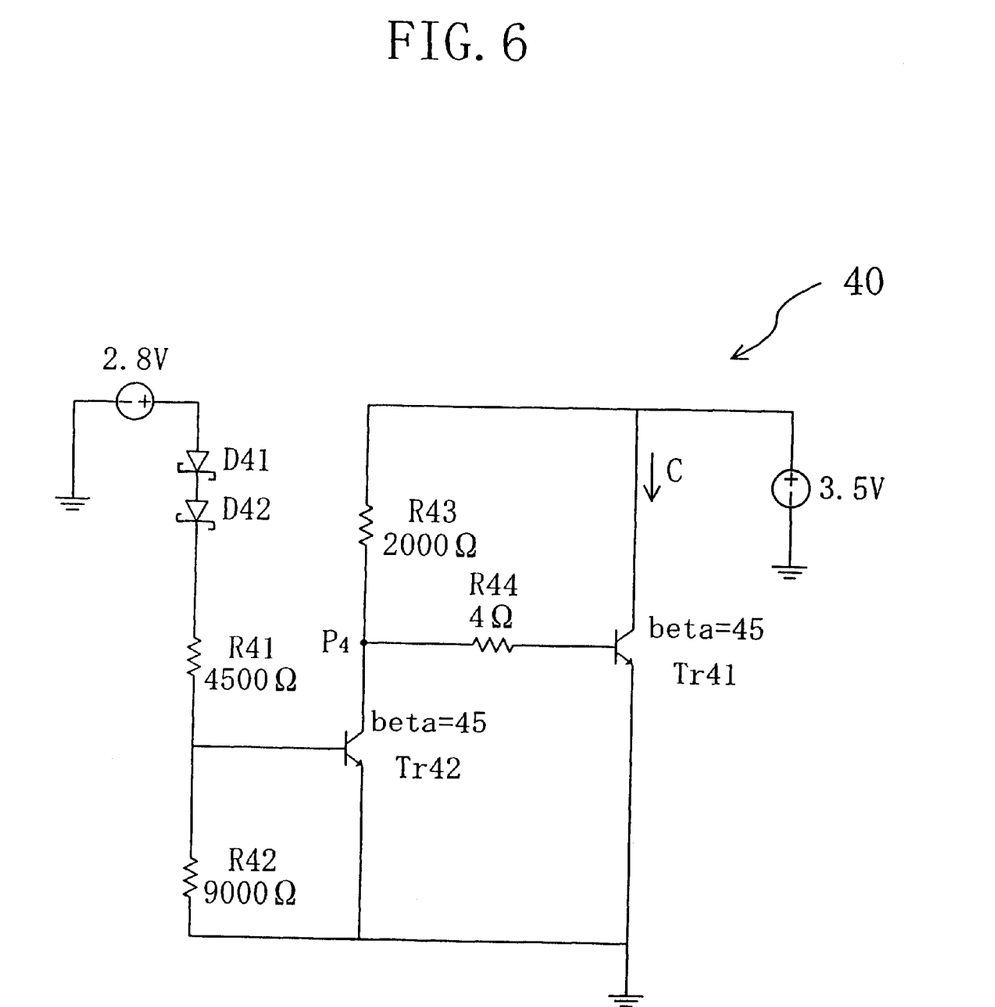
FIG. 6 is a circuit diagram of a bias circuit according to Embodiment 4 of the invention.

FIG. 6 is a circuit diagram of a bias circuit 40 of Embodiment 4.

As is shown in FIG. 6, the bias circuit 40 includes bipolar transistors Tr41 and Tr42, Schottky diodes D41 and D42, and resistors R41 (4500 Ω), R42 (9000 Ω), R43 (2000 Ω) and R44 (4 Ω). The bipolar transistors Tr41 and Tr42 are the completely same bipolar transistors having a current amplification factor (β) of 45. The base of the transistor Tr41 functioning as a power transistor is connected through the resistor R43 to the collector of the transistor Tr42. Also, the base of the transistor Tr42 is connected to the Schottky diodes D41 and D42 and the resistor R41 connected in series and is grounded through the resistor R42.

In each of Embodiments 1 through 3, the power transistor Tr1 is supplied with abase current by the emitter-follower circuit, but the power transistor Tr1 of this embodiment is supplied with a base current through the collector.

When the temperature is increased in the bias circuit 40, the on state voltages of the Schottky diodes D41 and D42 is lowered, resulting in increasing the base potential of the transistor Tr42. As a result, the collector current of the transistor Tr42 is increased not only due to the temperature increase but also due to the increase of the base potential. Since the resistance of the resistor R43 is constant (2000 Ω), a voltage applied to the resistor R43 is increased as the current increases. In other words, a potential at a point $P_4$ of FIG. 6 is lowered. Accordingly, the collector potential of the transistor Tr42 is lowered and the base potential of the transistor Tr41 is lowered. As a result, the idle current C of the power transistor Tr41 is suppressed from increasing in accordance with the temperature increase. In the case of temperature decrease, the idle current C of the transistor Tr41 is suppressed from decreasing in accordance with the temperature decrease through the completely reverse mechanism.

Figure 7:
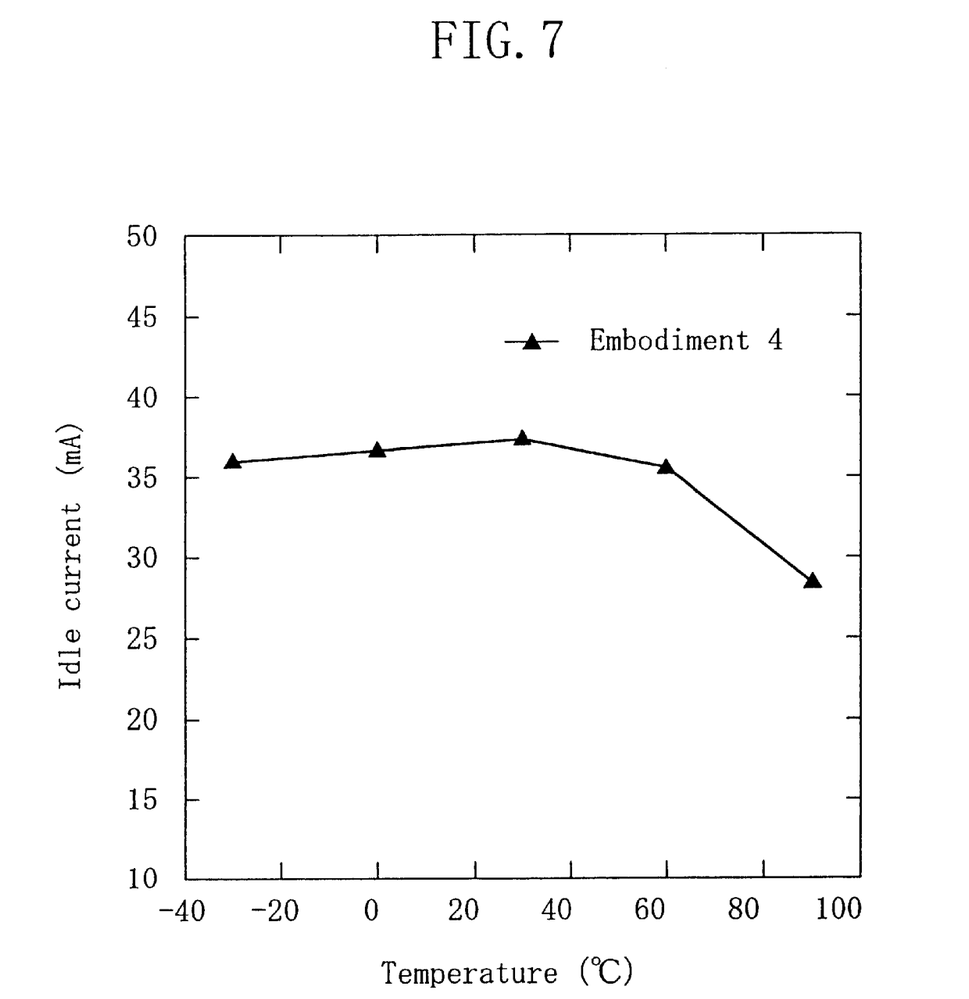
FIG. 7 is a diagram for showing temperature dependency of an idle current flowing through a power transistor of Embodiment 4.

FIG. 7 shows a simulation result of this embodiment. As is shown in FIG. 7, the bias circuit of this embodiment exhibits a substantially flat temperature characteristic.

Although the two Schottky diodes D41 and D42 are used in this embodiment, the number of Schottky diodes can be one, three or more by adjusting the supply voltage, resistances and the like.

Now, a method of fabricating a semiconductor device, that is, a bipolar integrated circuit in which the elements of the bias circuit of this invention are integrated, will be described with reference to FIGS. 8(a) through 8(d) and 9(a) through 9(c). The fabrication method described below can be commonly employed for any bipolar integrated circuit including the elements of any of the bias circuits of Embodiments 1 through 4 equipped with the Schottky diodes.

Figure 8A:
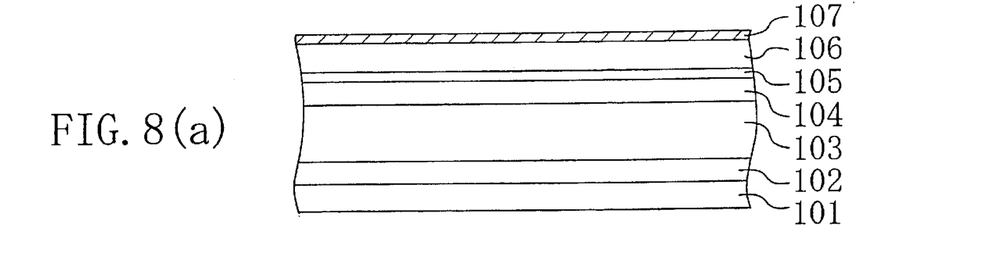
FIGS. 8(a), 8(b), 8(c) and 8(d) are cross-sectional views for showing procedures in a method of fabricating a bipolar integrated circuit of the invention.

In a procedure shown in FIG. 8(a), an $n^+$-GaAs layer 102, an $n^-$-GaAs layer 103, a $p^+$-GaAs layer 104, an n-InGaP layer 105 and an n-GaAs/$n^+$-InGaAs layer 106 are successively deposited on a GaAs substrate 101 by epitaxial growth. Subsequently, a WSi film 107, that is, a film of a metal with a high melting point, is deposited thereon by sputtering.

Figure 8B:
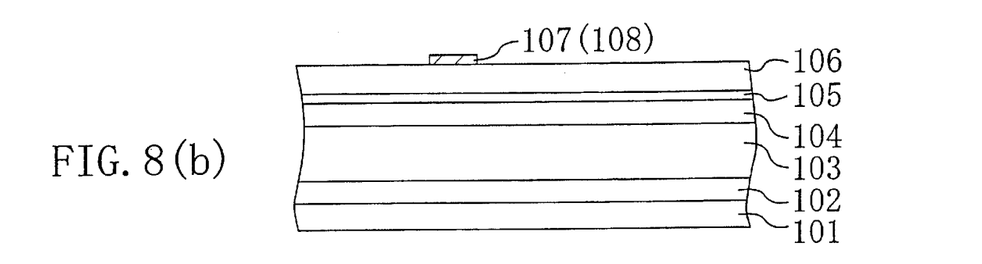

Next, in a procedure shown in FIG. 8(b), the WSi film 107 is patterned by photolithography and reactive dry etching into an emitter electrode 108.

Figure 8C:
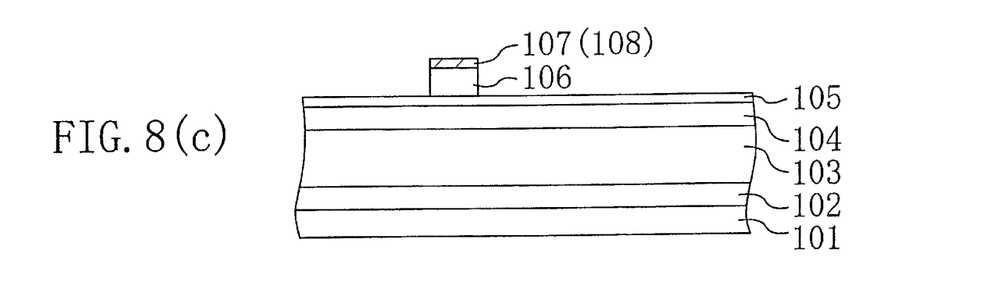

Then, in a procedure shown in FIG. 8(c), the n-GaAs/n$^+$-InGaAs layer 106 is etched by using the emitter electrode 108 as a mask with a mixed solution of sulfuric acid, hydrogen peroxide and water.

Figure 8D:
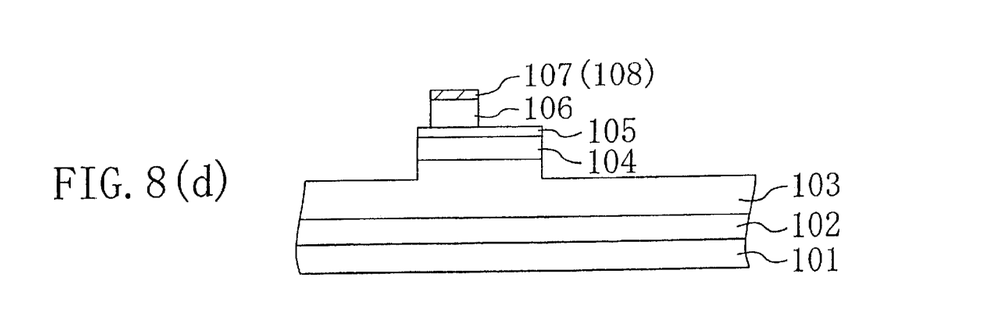

Then, in a procedure shown in FIG. 8(d), a resist pattern is formed on the substrate by the photolithography, and the resist pattern is used as a mask for etching the n-InGaP layer 105 with a mixed solution of hydrochloric acid and water and etching the p$^+$-GaAs layer 104 and part of the n$^-$-GaAs layer 103 with a mixed solution of sulfuric acid, hydrogen peroxide and water. Thus, a base mesa is formed.

Figure 9A:
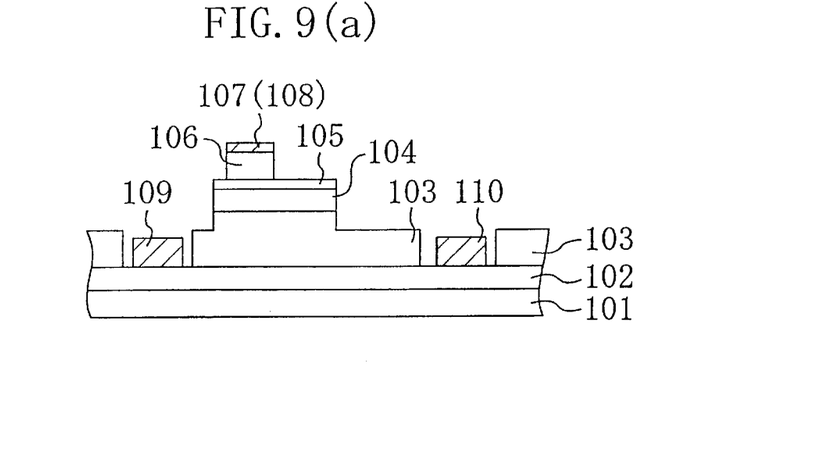
FIGS. 9(a), 9(b) and 9(c) are cross-sectional views for showing other procedures in the method of fabricating a bipolar integrated circuit of the invention.

Subsequently, in a procedure shown in FIG. 9(a), a resist pattern is formed on the substrate by the photolithography, and the resist pattern is used as a mask for etching the n$^-$-GaAs layer 103 with a mixed solution of sulfuric acid, hydrogen peroxide and water. Then, a collector electrode 109 and an ohmic electrode 110 of AuGe/Au are simultaneously formed on the n$^+$-GaAs layer 102 by a lift-off method. Thereafter, a heat treatment is preferably conducted at 450° C. so that the collector electrode 109 and the ohmic electrode 110 can exhibit good ohmic characteristic.

Figure 9B:
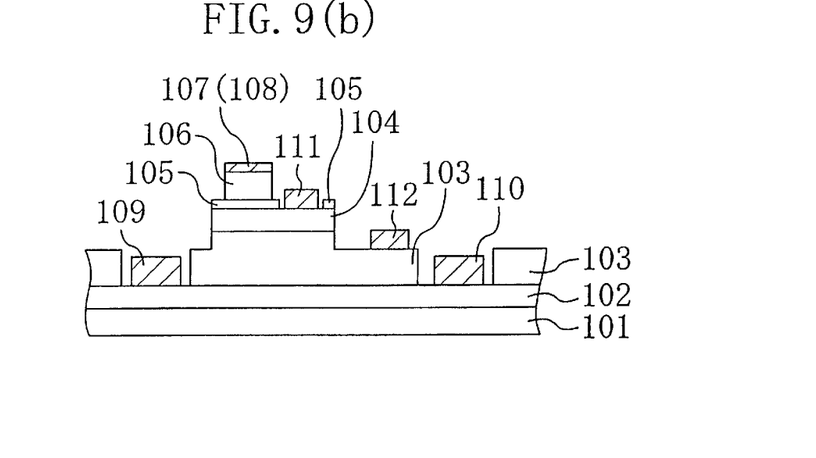

Next, in a procedure shown in FIG. 9(b), a resist pattern is formed on the substrate by the photolithography, and the resist pattern. is used as a mask for etching the n-InGaP layer 105 with a mixed solution of hydrochloric acid and water. The mixed solution of hydrochloric acid and water never etches the p$^+$-GaAs layer 104 and the n$^-$-GaAs layer 103. Thereafter, a base electrode 111 and a Schottky electrode 112 of Ti/Pt/Au are simultaneously formed by the lift-off method.

Figure 9C:
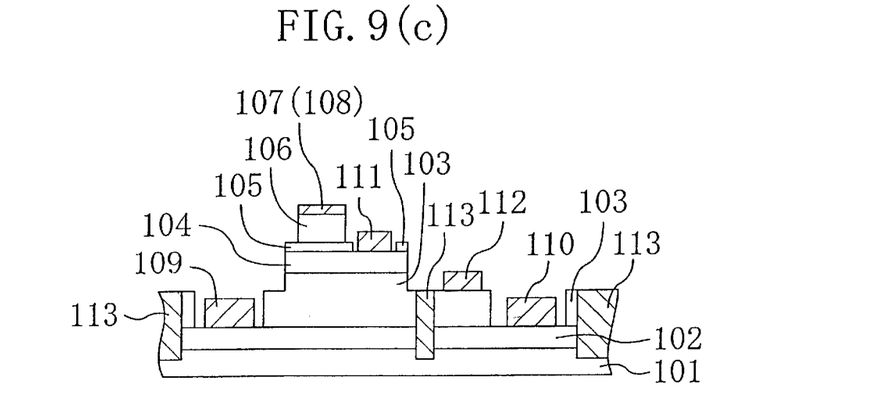

Then, in a procedure shown in FIG. 9(c), hydrogen is implanted into a region between the base mesa and the Schottky electrode 112 and a region between this circuit and an adjacent device, thereby forming high-resistance regions 113. In this manner, an HBT and a Schottky diode are formed, resulting in fabricating the bipolar integrated circuit excluding interconnections. Although the devices are electrically separated from one another by hydrogen implantation in this embodiment, the devices may be electrically separated by etching. The interconnections are formed after the procedure of FIG. 9(a) by a known method.

In the bipolar integrated circuit fabricated in the aforementioned manner, the n$^+$-GaAs layer 102 serves as a collector contact layer, the n$^-$-GaAs layer 103 serves as a collector layer, the p$^+$-GaAs layer 104 serves as a base layer, the n-InGaP layer 105 serves as an emitter layer, and the n-GaAs/n$^+$-InGaAs layer 106 serves as an emitter contact layer.

Although a fabrication method in forming an HBT of InGaP/GaAs is described in this embodiment, the fabrication method is applicable to an HBT of AlGaAs/GaAs, InP/InGaAs, InAlAs/InGaAs or Si/SiGe and a general bipolar transistor having homojunction.

In the aforementioned method of fabricating a bipolar integrated circuit, there is no need to additionally conduct a procedure for growing a new semiconductor layer or a procedure for forming a Schottky electrode in order to add a Schottky diode to the bipolar integrated circuit including an HBT. In other words, a bipolar integrated circuit including a Schottky diode formed on the same chip can be fabricated without increasing the number of procedures as compared with that of a method of fabricating a conventional bipolar integrated circuit.

What is claimed is:

1. A bias circuit comprising:

a first bipolar transistor, which is a heterojunction bipolar transistor, having an emitter, a base and a collector; and at least one Schottky diode connected to the base of said first bipolar transistor, said at least one Schottky diode being disposed for supplying a base potential for suppressing a collector current of said first bipolar transistor from changing in accordance with temperature change.

2. The bias circuit of claim 1, further comprising:

a second bipolar transistor having an emitter, a base and a collector;

a PN diode connected to the base of said second bipolar transistor; and two or more Schottky diodes connected to the base of said second bipolar transistor, wherein the emitter of said second bipolar transistor is connected to the base of said first bipolar transistor, and said two or more Schottky diodes are connected to said PN diode in series.

3. The bias circuit of claim 1, further comprising:

a second bipolar transistor having an emitter, a base and a collector; and three or more Schottky diodes connected to the base of said second bipolar transistor in series, wherein the emitter of said second bipolar transistor is connected to the base of said first bipolar transistor.

4. The bias circuit of claim 2, further comprising at least one Schottky diode connected to be branched from connection between the emitter of said second bipolar transistor and the base of said first bipolar transistor.

5. The bias circuit of claim 4, wherein said first and second bipolar transistors are heterojunction bipolar transistors.

6. The bias circuit of claim 1, further comprising:

a second bipolar transistor having an emitter, a base and a collector; and one or more Schottky diodes connected to the base of said second bipolar transistor in series, wherein the collector of said second bipolar transistor is connected to the base of said first bipolar transistor.

* * * * *